United States Patent [19]
Rainey

[11] 4,100,055
[45] Jul. 11, 1978

[54] TARGET PROFILE FOR SPUTTERING APPARATUS

[75] Inventor: Robert M. Rainey, Ben Lomond, Calif.

[73] Assignee: Varian Associates, Inc., Palo Alto, Calif.

[21] Appl. No.: 805,485

[22] Filed: Jun. 10, 1977

[51] Int. Cl.² ............................................. C23C 15/00
[52] U.S. Cl. .................................................... 204/298
[58] Field of Search ................ 204/192 R, 192 C, 298

[56] References Cited

U.S. PATENT DOCUMENTS

| | | | |
|---|---|---|---|
| 3,895,602 | 7/1975 | Bobenrieth | 118/49.1 |
| 4,041,353 | 8/1977 | Penfold et al. | 315/267 |

OTHER PUBLICATIONS

P. J. Clarke, "The S-Gun: A Direct Replacement for the Electron Beam Evaporator", *Solid State Technology*, Dec. 1976, pp. 77-79.

*Primary Examiner*—Aaron Weisstuch
*Attorney, Agent, or Firm*—Stanley Z. Cole; Leon F. Herbert; Edward H. Berkowitz

[57] ABSTRACT

A planar diode sputtering source employs an anode and a generally concave cathode. The interior surfaces of the cathode include an outer portion providing a lip for protecting a surrounding cooling jacket from sputtering, a middle portion configured to optimize the average match between the surface thereof with a surrounding magnetic field for long useful life, and an inner portion. The middle and outer portion are faired together to minimize localized target erosion leading to premature target depletion or failure. The inner portion joins the middle portion with surface tangents meeting at an angle which minimizes local erosion at this juncture.

6 Claims, 8 Drawing Figures

U.S. Patent  July 11, 1978  4,100,055
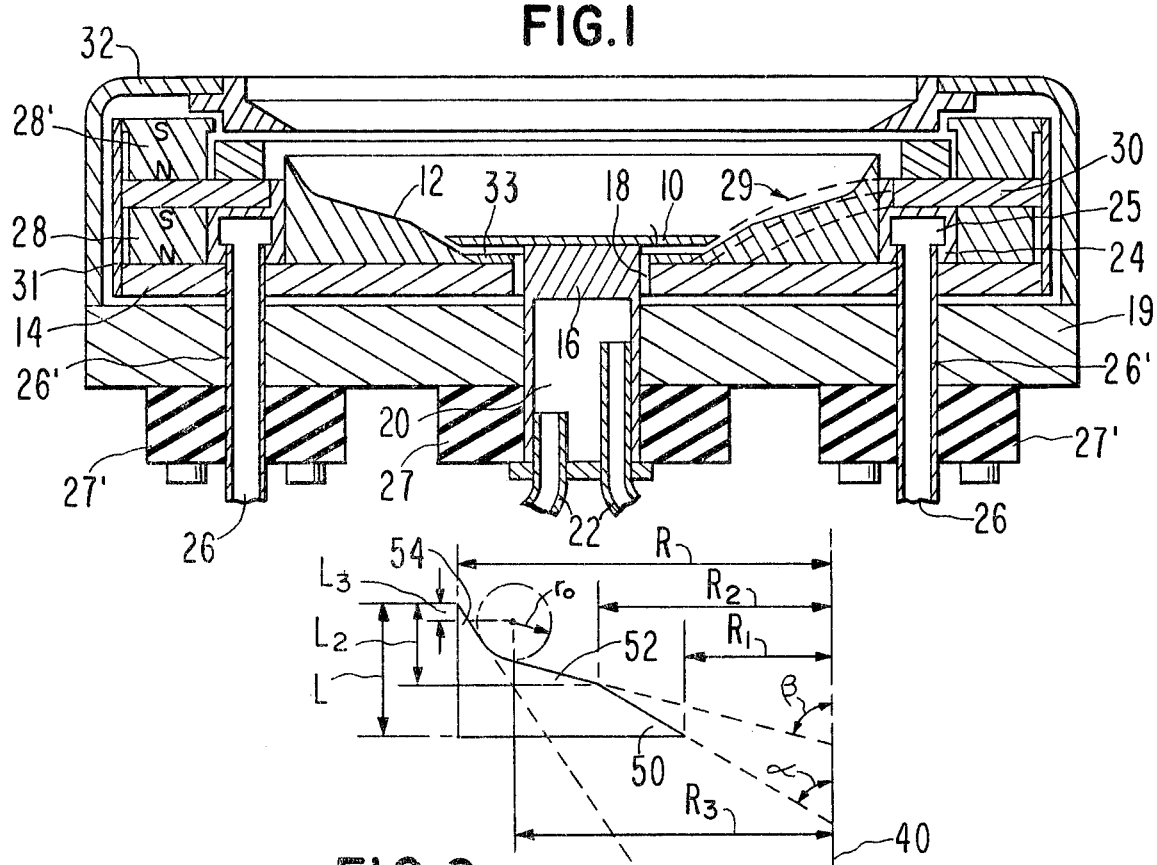
FIG.1
FIG.2
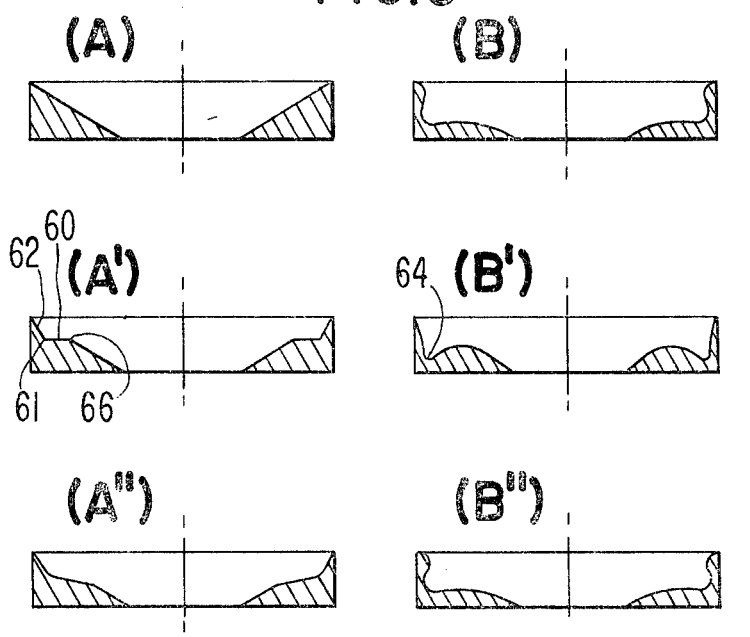
FIG.3

TARGET PROFILE FOR SPUTTERING APPARATUS

FIELD OF THE INVENTION

This invention is in the field of vacuum sputter coating apparatus and particularly relates to target construction for such apparatus.

Sputtering apparatus includes an open-ended cathode and an anode structure in an evacuated enclosure. Ions formed in the interelectrode space impact a target located on the cathode surface ejecting atoms of the target from the surface and near subsurface atomic layers thereof. These ejected, or sputtered atoms deposit on articles or substrates placed in line of sight of the target, thereby producing a relatively uniform deposited film. The basic apparatus is enhanced by application of a magnetic field surrounding the target which serves to confine the plasma discharge to the neighborhood of the electrodes, and to prevent electrons from bombarding the substrates, at the same time lengthening the electron paths in the neighborhood of the electrodes. Thus, the number of ionizing collisions between electrons and gas molecules is increased, thus yielding a greater ion current and higher sputtering rates. Operation is also facilitated at much lower gas pressures where the density of gas molecules is proportionately lower.

During the lifetime of the cathode target, material sputters therefrom and the target consequently erodes. It is advantageous to employ target geometry from which the desired sputtering rate may be sustained over a prolonged period of use. Prior art target geometries employed have included a cylindrical cathode surrounding an axially mounted anode. The interior surface of the cathode in such apparatus was parallel to its axis and to the outer surface. In another form the cathode interior surface is tapered, the radial cross-section of such cathode having a distinctly wedged shape. Yet another prior art target, as for example described in Varian Associates, Inc. brochure Vac 2436A, employed a composite of two distinct rates of taper in the cathode interior wall with an intermediately disposed flat step.

SUMMARY OF THE INVENTION

The present invention employs a target configured to include an outer portion or lip which protects a surrounding target cooling jacket from sputtering. A middle portion has a surface, which over the life of the target, bears an average parallel relationship to the average tangential component of the discharge confining magnetic field at the target surface. This portion is configured to increase the magnetic field in the region of the discharge, permitting a much lower sputtering voltage in the early stages of operation. The transitions between the middle and outer portions of the target surface are made smooth and non-angular to minimize any electrostatic focussing of impacting ions in the transition region which would concentrate the ion flux. The inner portion of the target is configured to form a convex transition region with the middle portion to avoid a concentration of bombarding ion flux.

It is an object of the present invention to obtain a sputtering target capable of sustaining significantly greater plasma current density and having a longer useful life.

It is a feature of the present invention that power dissipation in a plasma discharge is maintained more nearly constant over the useful life of a target.

BRIEF DESCRIPTION OF THE DRAWINGS

FIG. 1 is a section of an apparatus incorporating an embodiment of the invention.

FIG. 2 is a profile of the target of the present invention.

FIGS. 3A, 3A' and 3A" show initial profiles of two prior art targets and the target according to the present invention.

FIGS. 3B, 3B' and 3B" show the prior art targets and the target according to the present invention at the end of the useful lives thereof.

DETAILED DESCRIPTION OF THE INVENTION

The present invention is described in the context of the sputtering gun source of FIG. 1. FIG. 1 is a section of such apparatus. Cylindrically symmetric geometry is preferred but by no means essential to the principles described herein. An anode 10 is disposed centrally and generally within an open-ended surrounding cathode structure 12. Mechanical alignment is maintained by mounting cathode 12 on lower magnetic pole piece 14 and mounting anode 10 on anode post 16, preferably of copper, electrically isolated from pole piece 14 and separated from cathode 12 by annular space 18, and mounted on base plate 19 by flange 27. Anode post 16 has internal cooling cavity 20 through which a coolant, preferably water, circulates by means of conduits 22. Cathode cooling is provided by member 24, preferably of copper, which has an internal channel 25 through which a coolant, preferably water, is curculated via conduits 26 electrically isolated from base plate 19, for example by making conduits 26 of electrically non-conducting material. Conduits 26 are secured to plate 19 by flanges 27'. Magnets 28 and 28' having indicated relative polarities provide a magnetic field which has the generally indicated fringing field direction 29 at a point central to the anode and cathode electrodes and similar field direction in proximity to the cathode surface. The main magnetic field is maintained between lower pole piece 14 and upper pole piece 30. A magnet retainer 31, of nonmagnetic material, defines the outer limit for accurately locating the magnets 28 with respect to pole pieces 14 and 25. In a cylindrical geometry, these magnets may be annular or alternatively a plurality of bar magnets may be arranged to provide the required field. The strength of the magnetic field is sufficient to prevent secondary electrons from the cathode from reaching the workpiece (not shown) which workpiece is disposed generally above this apparatus. A ground shield 32 defines the electric field and the plasma density.

Anode 10 is secured to mounting post 27 by screws (not shown). A retaining ring 33, also isolated from anode post 27 by insulating gap 18, is used to secure cathode 12 to lower magnetic pole piece 14 by screws (not shown). When the source is inverted with respect to the aspect of FIG. 1, retaining ring 33 is required to secure cathode 12. The use of the retaining ring 33 is optional when the source is employed below the articles to be coated.

In typical operation, the anode is maintained at ground potential and the cathode may be held at potentials ranging from −350 volts to −1000 volts, depending upon the cathode material. As shown in the drawing, the ground shield 32 is at ground potential. The anode may be at ground potential or biased slightly above ground to protect the articles to be coated from secondary electrons created at the anode.

Sputtering apparatus are particularly sensitive to target shape for a number of reasons. The electric field distribution in the neighborhood of the plasma discharge is influenced by the target shape because the target shape imposes a boundary condition upon the electric field in accord with well-known laws of electrostatic theory. Moreover, the shape changes during the useful life of the target as target material is eroded away. It is desired to retain for as long as possible an optimum target profile thereby extending the useful life of the target. In accord with these desired ends, an investigation of target shape detail has been pursued retaining the general, open-ended profile for surrounding the centrally disposed anode.

Turning now to FIG. 2, the target of the present invention is described in more detail. FIG. 2 shows a radial cross-section of the target but hatching has been omitted to avoid obscuring the detailed description of the shape. An inner surface portion 50 is characterized by the angle $\alpha$ formed by the surface tangent of the anode-facing surface thereof with respect to center line 40; an intermediate portion 52, for which the surface tangent forms an angle $\beta$ with center line 40; and finally an outer portion 54 characterized by a surface tangent forming an angle $\gamma$ with respect to center line 40. The angle $\alpha$ is of intermediate magnitude, $\beta$ being larger and $\gamma$ smaller. The absolute value of $\beta$ is first chosen in conjunction with the design of magnets 20 and 28' and their respective pole pieces 14 and 30 because the greater part of sputtering occurs from the portion 52 and the performance of the apparatus is most sensitive to the magnetic field in the neighborhood of portion 52 as hereinafter described. The magnetic field may be regarded as having some average curvature and strength relative to the surface of the target, time averaged over the useful life of the target. It is desirable to so configure the portion 52 that with respect to the surface of this portion of the cathode, the tangential component of the magnetic field is maximized over the useful life of the target.

The portion 54 smoothly joins the portion 52. The smoothness of this intersection is essential to eliminate localized erosion of the target which can result in premature termination of the useful life of the target. A discontinuity at this point causes the electric field in the neighborhood thereof to focus the bombarding ions in the region of the discontinuity, thereby accelerating target erosion in this region. Accordingly, the preferred embodiment is characterized in this regard by a radius of curvature, $r_o$, descriptive of the fairing of the juncture of the surfaces bounding portions 52 and 54.

Portion 54 forms a lip and serves to geometrically shield the cooling jacket 24 from the plasma discharge thereby protecting the cooling jacket from damage by sputtering.

Cooling of the cathode 12 is a sensitive function of thermal conductance between cathode 12 and water jacket 24. The present invention employs a cathode dimensioned to loosely fit the inner surface of water jacket 24: upon heating of the cathode, expansion insures a close contact with water jacket 24 providing sufficient heat transfer characteristics to obtain proper cooling. Room temperature clearance between these members must be sufficient to allow easy removal, yet close enough to provide adequate thermal conductance to the water jacket to prevent melting or warping at operating temperature.

Turning now to FIGS. 3, there is contrasted prior art cathode profile shapes (FIGS. 3A and 3A') with that of the present invention (FIG. 3A") prior to use. FIGS. 3B, 3B' and 3B" show typical end of useful life profiles for the respective targets. Useful life is ultimately limited in one aspect by the erosion of the target which can eventually rupture the target structure through its lateral wall exposing the water jacket to sputtering. This aspect of useful life also depends upon the magnetic field at the surface of the cathode as well as the power drawn from the power supply in energizing the discharge. Thus, in tests with a particular current limited power supply of 7Kw nominal dissipation, useful life in dc operation with a specific target is defined to correspond to a safe power supply current range from 9 to 12 amperes at 800 to 500 volts for a given magnetic field.

Representative parameters for a target profile of the present invention are obtained after fixing power supply and magnetic field specifications as a choice of design. The power source current and voltage ranges are independently selected, for example, as given above. The magnetic field is realized with magnets and pole pieces which provide for a magnetic field of sufficient strength in the neighborhood of the discharge to couple the desired magnitude of power from the power source to the discharge. In studies of the erosion patterns of prior art targets such as that shown in FIG. 3a, it was observed that at an intermediate point in the life of the target the power drawn from the power source increased, apparently due to a more effective coupling of the power source to the discharge. As erosion of the surface progressed, the location of the surface became displaced nearer the magnet assembly thus increasing the magnetic field strength in the neighborhood of the discharge and altering the relative orientation of the magnetic field and the target surface. It is believed that the magnetic field at this point in operation more effectively confined the electron flux of the discharge, thereby yielding higher effective current with consequently greater ionization density finally resulting in a proportionately greater sputtering rate. Although the corresponding end-of-useful-life profile of FIG. 3B is acceptable, the variation in power drawn from the power supply results in variable sputtering rates. The consequent variation in discharge potential affects the kinetic energy of the sputtered material and is known to influence the quality of the coating.

In order to obtain this improved power coupling at the outset of target use, another prior art target profile (FIG. 3A') was obtained by introducing a flat step into the profile of FIG. 3A at a region of relatively high plasma density. Studies of this modification indicated that a substantial quantity of material, sputtered from the vicinity of the step, was redeposited upon the target leading to an end of life profile as in FIG. 3B'. This end-of-useful-life profile is undesirable because of the quantity of material remaining. It is believed that erosion from the vicinity of the angular juncture 61 of the step 60 with the lip 62 was accelerated due to electrostatic focusing of ions, thereby concentrating ion bombardment in this region, and by trapping of secondary electrons in this region as erosion progressed. The depression, such as that shown as region 64 in FIG. 3B', was thus produced.

The present invention minimizes the selective bombardment of region 61 and the ensuing electron trapping by sloping the surface 60 and by fairing the junction of surfaces 60 and 62 so as to eliminate the sharp angular juncture productive of these effects. The angular juncture 66 is similarly minimized by sloping the surface 60. The resulting end-of-useful-life profile of FIG. 3B is again acceptable while the variation in power dissipation in the discharge is substantially reduced.

Returning now to FIG. 2, a representative set of dimensions are given for a particular configuration having cylindrical symmetry. In this example the axial length, L, is 0.88 inches and the outside radius R is 2.576 inches with a central aperture $R_1$ of 1.06 inches. The juncture of inner and middle portions 50 and 52 occurs at $L_2 = 0.504$ inches and $R_2 = 1.711$ inches. Respective angles $\alpha$, $\beta$, and $\gamma$ are 60°, 75° and 35°. A fairing radius $r_o$ of substantially 0.250 inches for this embodiment about a center located at $R_3 = 2,191$ inches and $L_3 = 0.115$ inches is used. Thus the angle included between the surface tangents of the outer and middle portion is 40°. The angle included between the surface tangents of the middle and inner portion is 150°. Alternatively, the middle portion and inner portion may be described as intersecting at an obtuse angle of 50°. Similarly, the middle portion and outer portion may be described as forming an angle of 140°. For a typical target of Al-2%Si-4%Cu a target of the present invention will sustain approximately 100 kilowatt hours of sputtering at voltages in the range from 400 to 800 volts using a standard power source. Comparable targets of the prior art (FIG. 3A') would typically sustain only about 75 kilowatt hours using the same standard power source. The FIG. 3A targets drew insufficient power from the same standard power source at the outset of operation and thus degraded the quality of the coating.

Although the preferred embodiment has been shown and described with respect to a system having a symmetric circular shape, it should be understood that other configurations come within the purview of the invention. For example, the target and associated elements such as the magnet system could have an open rectangular shape when viewed from the top. Also, the arrangement could be in the form of a strip line which can be visualized by considering that only one side of FIG. 1 is employed and the anode, target, magnets and pole pieces are straight elements elongated in the direction into the paper in FIG. 1.

Since many changes can be made in the above construction and many apparently widely differing embodiments of this invention could be made without departing from the scope thereof, it is intended that all matter contained in the above description and shown in the accompanying drawing shall be interpreted as illustrative and not in a limiting sense.

What is claimed is:

1. A target for sputter coating apparatus comprising an annular body having an inner surface surrounding and generally sloping away from a central axis of said body, said surface comprising an inner portion, a middle portion and an outer portion closest said axis, a tangent to the surface of said middle portion forming a first angle with said axis, a tangent to the surface of said inner portion forming a second angle with said axis, a tangent to the surface of said outer portion forming a third angle with said axis, said first angle being an acute angle, and said first angle being different from said second and third angles, wherein said first angle is acute, said second angle is more acute than said first angle, and said third angle is more acute than said second angle.

2. The apparatus of claim 1 wherein said middle portion and said outer portion are smoothly joined.

3. The apparatus of claim 1 wherein the angle included between the tangents to said middle and outer portions is about 40°, and the angle included between the tangents to said middle and inner portions is about 15°.

4. The apparatus of claim 1 wherein said inner surface is radially symmetric with respect to said axis.

5. In a sputter coating apparatus having a target, the improvement wherein the target comprises a sputtering surface having a cross-sectional profile comprising a center portion, a first extremity portion on one side of said center portion and a second extremity portion on the other side of said center portion; said cross-section profile having a bottom wall intersecting a side wall; said first extremity portion sloping substantially linearly downwardly from the upper portion of said side wall; and said center portion sloping substantially linearly downwardly from its junction with said first extremity portion toward its junction with said second extremity portion said second extremity portion sloping substantially linearly downwardly from its junction with said center portion, the slope of said first extremity portion being steeper than the slope of said second extremity portion and the slope of said second extremity portion being steeper than the slope of the center portion.

6. The apparatus of claim 5 wherein said center portion and said first extremity portion are smoothly joined.

* * * * *

UNITED STATES PATENT AND TRADEMARK OFFICE
CERTIFICATE OF CORRECTION

PATENT NO. : 4,100,055

DATED : July 11, 1978

INVENTOR(S) : Robert M. Rainey

It is certified that error appears in the above–identified patent and that said Letters Patent are hereby corrected as shown below:

Column 2, line 35, "change "curculated" to --circulated--.
Column 5, line 7, change "3B" to --3B''--; line 23, change "150°" to --15°--; and line 25, change "50°" to --165°--.
Claim 1, line 4, after "inner portion" insert --closest said axis--; and line 5, cancel "closest said axis".

Signed and Sealed this

Twenty-eighth Day of April 1981

[SEAL]

Attest:

RENE D. TEGTMEYER

Attesting Officer     Acting Commissioner of Patents and Trademarks